US006701843B2

(12) United States Patent
Verschueren et al.

(10) Patent No.: US 6,701,843 B2
(45) Date of Patent: Mar. 9, 2004

(54) METHOD OF LITHOGRAPHIC PRINTING WITH A REUSABLE SUBSTRATE

(75) Inventors: Eric Verschueren, Merksplas (BE); Joan Vermeersch, Deinze (BE)

(73) Assignee: Agfa-Gevaert (BE)

( * ) Notice: Subject to any disclaimer, the term of this patent is extended or adjusted under 35 U.S.C. 154(b) by 40 days.

(21) Appl. No.: 09/945,474

(22) Filed: Aug. 30, 2001

(65) Prior Publication Data

US 2002/0053296 A1 May 9, 2002

Related U.S. Application Data

(60) Provisional application No. 60/243,942, filed on Oct. 27, 2000.

(30) Foreign Application Priority Data

Sep. 18, 2000 (EP) .............................................. 00203224

(51) Int. Cl.$^7$ .............................. B41N 1/08; C11D 9/22
(52) U.S. Cl. ...................... 101/478; 101/424; 510/171
(58) Field of Search ................................ 101/453, 454, 101/457, 462, 463.1, 465, 466, 467, 478, 423, 424, 425; 510/171

(56) References Cited

U.S. PATENT DOCUMENTS

| 2,016,517 | A |   | 10/1935 | Rowell |   |
|---|---|---|---|---|---|
| 3,108,535 | A | * | 10/1963 | Uhlig | .......................... 101/457 |
| 4,351,895 | A | * | 9/1982 | Walls | .......................... 430/309 |
| 4,829,897 | A | * | 5/1989 | Wyman et al. | .............. 101/425 |
| 5,203,926 | A |   | 4/1993 | Bondurant |   |
| 5,731,124 | A | * | 3/1998 | Jonckheere et al. | ........ 101/459 |
| 5,736,256 | A | * | 4/1998 | Fromson et al. | ............. 430/302 |
| 5,816,161 | A | * | 10/1998 | Nussel | ........................ 101/458 |
| 6,110,644 | A | * | 8/2000 | Vermeersch et al. | ......... 101/456 |
| 6,136,503 | A | * | 10/2000 | Zheng et al. | ................ 101/467 |
| 6,427,596 | B1 | * | 8/2002 | Bhambra et al. | ............ 101/465 |

FOREIGN PATENT DOCUMENTS

| DE | 28 41 383 A |   | 4/1980 |
|---|---|---|---|
| EP | 389283 | * | 6/1990 |
| GB | 2 089 289 A |   | 6/1982 |
| JP | 54-89806 | * | 7/1979 |
| JP | 59-220398 | * | 12/1984 |
| JP | 62-27190 | * | 2/1987 |
| JP | 62-80663 | * | 4/1987 |
| JP | 7-17155 |   | 1/1995 |

* cited by examiner

*Primary Examiner*—Stephen R. Funk
(74) *Attorney, Agent, or Firm*—Leydig, Voit & Mayer, Ltd.

(57) ABSTRACT

A method for removing ink-accepting areas of a lithographic printing master is disclosed which enables to recycle the lithographic substrate of the printing master. The method comprises the following step which is preferably carried out on-press: applying a cleaning liquid to the printing master, the cleaning liquid being an emulsion of an organic compound in water, further comprising a compound according to formula (I):

(I)

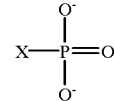

wherein X=OH, O⁻, a polymer backbone.

21 Claims, No Drawings

METHOD OF LITHOGRAPHIC PRINTING WITH A REUSABLE SUBSTRATE

This application claims the benefit of U.S. Provisional Patent Application No. 60/243,942, filed Oct. 27, 2000.

FIELD OF THE INVENTION

The present invention relates to a cleaning method for recycling the lithographic substrate of a printing master.

BACKGROUND OF THE INVENTION

In conventional lithographic printing, ink and an aqueous fountain solution are supplied to the surface of a printing master that contains ink accepting (oleophilic) and water-accepting (hydrophilic) areas. The inked image pattern is then transferred from the surface of the master to a blanket cylinder having a compressible surface. From the blanket cylinder the image is impressed onto paper. The master is typically a printing plate that carries an image on a dimensionally stable substrate such as an aluminum sheet. The imaged aluminum plate is secured to the plate cylinder of a printing press by a mechanical lock-up mechanism that defines positional registration between the plate and the surface of the cylinder. After the end of the press run, the mechanical lock-up system is released so that the printing plate carrying the printed image can be removed and discarded and another printing plate can be positioned and locked into place. A new print job can then be started.

Printing masters are generally obtained by the so-called computer-to-film method wherein each color selection is transferred to graphic arts film using an image-setter. After processing, the film can be used as a mask for the exposure of an imaging material called plate precursor and after plate processing, a printing plate is obtained which can be used as a master. These steps are usually performed in dedicated exposure and processing equipment and the printing plates are then transported to the printing press and attached to the printing cylinder by press operators using a lock-up mechanism built into the cylinder itself. Although the attachment of the printing cylinder is generally a manual operation, robotic means have been developed for positioning and securing the printing plates.

In recent years the so-called computer-to-plate method has gained a lot of interest. This method, also called direct-to-plate method, bypasses the creation of film because the digital data are transferred directly to a plate precursor by means of a so-called plate-setter. On-press imaging is a direct-to-plate method (also called direct-to-press), wherein the image is exposed on the plate while said plate is mounted on the plate cylinder of a printing press. The major advantage of the latter method compared to off-press plate making is the improved registration between printing stations of a multi-color printing press.

Two types of such on-press imaging methods are known. According to a first type, a printing plate precursor is mounted on a printing press, image-wise exposed, optionally developed, and then used as a printing master and finally removed from the press and disposed of, thus requiring a new plate material for each image. An example of this technology is the Heidelberg Model GTO-DI, manufactured by Heidelberg Druckmaschinen AG (Germany) which is described in detail in U.S. Pat. No. 5,339,737. A drawback of this method is the need to use a new plate for each press run, thus increasing the cost of the printing process.

In a second type of on-press imaging systems, the same lithographic substrate is used in a plurality of press runs (hereinafter called printing cycles). In each printing cycle, a heat-sensitive or photosensitive layer is coated on the lithographic substrate to make a printing plate precursor and after image-wise exposure and optional development a printing master is obtained. After the press-run, the ink-accepting areas of the printing master are removed from the lithographic substrate in a cleaning step so that the substrate is recycled and can be used in a next cycle of coating, exposing and printing without the need to mount a new plate on the cylinder. Examples of such on-press coating and on-press imaging systems are described in e.g. U.S. Pat. Nos. 5,188,03; 5,713,287; EP-A 786 337 and EP-A 802 457. The latter patent application describes an apparatus comprising a printing member, means for applying a uniform coating, means for scan-wise exposing said uniform coating in accordance with an image pattern and means for developing said uniform coating to leave an image on said printing member, the image consisting of ink-accepting areas on an ink-repellent background or ink-repellent areas on an ink-accepting background. According to a preferred embodiment, the coating comprises hydrophobic thermoplastic polymer particles in a hydrophilic binder.

Cleaning liquids for lithographic printing plates have been described in EP-A-0200176, EP-A-0200177 and EP-A-0200178 all filed on 18-01-2000 and DE-A-42 16 636.

The known cleaning liquids typically contain solvents which are harmful to hoses, pumps and sealings and/or require a very thorough rinsing with water because these liquids are not compatible with the coating step in the next printing cycle.

In the known on-press coating methods, the cleaning of the lithographic substrate often fails because no suitable compromise can be found between the chemical reactivity of the cleaning liquid versus the ink-accepting areas which have to be removed on the one hand and the required inertness of said cleaning liquid versus the fragile lithographic surface on the other hand. A typical lithographic surface is mechanically as well as chemically quite vulnerable. A lithographic surface consists generally of a micropore structure in order to differentiate the spreading properties of the ink and the fountain. Anodized aluminum plates comprise a lithographic surface containing one or more metal oxides on which absorption phenomena can take place. These metal oxides are very susceptible to chemical conversion into forms that are no longer lithographically active.

The above mentioned micro-porosity of a lithographic surface is also highly susceptible to mechanical damage. The presence of solid particles in cleaning liquids, which is often required for efficient mechanical cleaning of the lithographic surface, results inevitably in a disturbance of the microstructure of said surface. Because ink and the coated imaging layer penetrate in the micro-pore structure, it is necessary to carry out a vigorous cleaning so as to avoid ghost images in the subsequent printing cycles, which are due to an incomplete removal of the previous image.

SUMMARY OF THE INVENTION

It is an object of the present invention to provide a lithographic printing method comprising a cleaning step whereby the ink-accepting areas of a printing master can be removed effectively so that the substrate can be reused in a next print cycle. More particularly, a cleaning step is required which is characterized by a low risk of deteriorating the lithographic surface of the substrate. It is also an object of the present invention to provide a printing method wherein a cleaning liquid is used which has a low organic volatile content to avoid environmental contamination:

The above objects are obtained by the method of claim 1. The cleaning liquid defined in claim 1 effectively removes the ink-accepting areas of the printing master. No ghost images are observed after several (>10) print cycles of coating, exposure, printing and cleaning. Rubber hoses and seals are not affected by the cleaning liquid.

Further objects of the present invention will become clear from the description hereinafter.

Preferred embodiments of the method of the present invention are defined in the dependent claims.

DETAILED DESCRIPTION OF THE INVENTION

The cleaning liquid according to the present invention is preferably an emulsion of an organic compound in water, further comprising a compound according to formula (I):

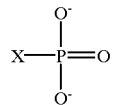

(I)

wherein X=OH, O⁻, a polymer backbone.

The counter ions can be, depending on the pH, metals such as alkali or alkaline earth metals or H.

Suitable examples of the compound according to formula (I) are polyvinylphosphonic acid, copolymers of vinylphosphonic acid with acrylic acid and vinyl acetate, acrylamidoisobutylene phosphonic acid. Preferably the compound is phosphoric acid or a phosphate salt. Preferably the compound is present in an amount of 1.5 to 6% (W/W). The emulsion preferably comprises as organic compound a mixture of an alcohol and a cyclic compound having at least one double bond. The alcohol used is preferably an aliphatic alcoholether. Suitable examples of such aliphatic alcoholethers are: methoxypropanol, propoxyethanol, 2-butoxyethanol, propanol, 2-(propyloxy)ethanol, fenoxyethanol, benzylalcohol, butoxypropanol, ethoxypropanol, 1-isobutoxy-2-propanol, 1-isomethoxy-2-propanol, 1-propoxy-2-propanol, diacetone alcohol, tetrahydrofurfuryl alcohol, cathechol, trimethylolpropane, ethanediol, propanediol, and butanediol. Highly preferred is 2-butoxyethanol. Suitable examples of cyclic compounds having at least one double are: toluene, xylene, propylbenzene, 3-methyl-6-isopropyl-1,4-cyclo-hexadiene, 3-(1-methylpropylidene)-cyclohexene, 6-methyl-1-(1-methylethyl)-1,3-cyclohexadiene, 4-methyl-5-(1-methylethenyl)-cyclohexene, o-mentha-4,6-diene, o-mentha-2(8),3-diene, o-mentha-1(7),4-diene, 6-methyl-1-(1-methylethenyl)-cyclohexene, 1-methyl-5-(1-methylethyl)-1,4-cyclohexadiene, isosylvestrene, 4-ethyl-3-ethylidene-cyclohexene, 1-ethyl-6-ethylidene-cyclohexene, o-mentha-3,6-diene, o-mentha-2,5-diene, o-mentha-1,4-diene, 3-methyl-4-isopropenyl-1-cyclohexene, 3-methyl-5-isopropenyl-1-cyclohexene, 2-methyl-3-propyl-1,3-cyclohexadiene, 1-methyl-6-propylidene-cyclohexene, tetranaphtalene and preferably dipentene (formula II).

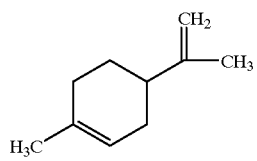

(II)

The alcohol and cyclic compound are preferably present in an amount of 5 to 50% (W/W) each and most preferably in an amount of 10 to 30% (W/W) each.

The aqueous emulsion is preferably also stabilized with an emulsifying agent such as polyalkylene oxide e.g. available under the trade name AKYPO® OP80, AKYPO® RO90 (both of Chem-Y), EMPICOL® ESC70 (of Albright & Wilson). The emulsifying agent is preferably present in an amount of 5 to 50% (W/W) and most preferably in an amount of 10 to 30% (W/W).

The cleaning liquids of the present invention are capable of removing the ink remaining on the printing areas as well as the hydrophobic coating itself that gives rise to the ink-accepting properties of the printing areas.

The above cleaning liquid are very suitable for removing the ink-accepting areas from a printing master which is obtained by coating a hydrophilic substrate with a coating solution containing hydrophobic thermoplastic polymer particles and a hydrophilic binder. The imaging material thus obtained is negative-working, i.e. hydrophobic areas are formed upon exposure. These areas define the printing areas of the master. It is believed that the applied heat induces a coagulation of the hydrophobic polymer particles, thereby forming a hydrophobic phase, whereas the hydrophobic polymer particles remain unchanged in the non-heated areas. Coagulation may result from heat-induced softening or melting of the thermoplastic polymer particles.

The imaging material which is preferably used in the present invention contains a coating comprising hydrophobic thermoplastic polymer particles having an average particle size between 40 nm and 2000 nm, and more preferably between 40 nm to 200 nm, so as to improve sensitivity and throughput and to avoid scumming. Furthermore the polymer particles preferably have a coagulation temperature above 50° C. and more preferably above 70° C. There is no specific upper limit to the coagulation temperature of the polymer particles, however the temperature should be sufficiently below the decomposition temperature of the polymer particles. Preferably the coagulation temperature is at least 10° C. below the temperature at which the decomposition of the polymer particles occurs.

Preferred examples of thermoplastic hydrophobic polymer particles for use the present invention have a Tg above 80° C. The weight average molecular weight of the polymers may range from 5,000 to 5,000,000 g/mol. Preferably the polymer particles are selected from the group consisting of polyvinyl chloride, polyvinylidene chloride, polyesters, polyurethanes, polyacrylonitrile, polyvinyl carbazole etc., and copolymers or mixtures thereof. The most preferred examples are polystyrene and polymethylmethacrylate or copolymers thereof.

The polymer particles are present as a dispersion in the coating solution and may be prepared by the methods disclosed in U.S. Pat. No. 3,476,937. Another method especially suitable for preparing an aqueous dispersion of the thermoplastic polymer particles comprises:

dissolving the hydrophobic thermoplastic polymer in an organic solvent which does not mix with water, dispersing the thus obtained solution in water or in an aqueous medium and removing the organic solvent by evaporation.

Suitable hydrophilic binders for use in the present invention are preferably water-soluble (co)polymers for example synthetic homo- or copolymers such as polyvinylalcohol, a poly(meth)acrylic acid, a poly(meth)acrylamide, a polyhydroxyethyl(meth)acrylate, a polyvinylmethylether or natural binders such as gelatin, a polysaccharide such as e.g. dextran, pullulan, cellulose, arabic gum, alginic acid, inuline or chemically modified inuline.

In addition, the coating solution may also contain surfactants that can be anionic, cationic, non-ionic or amphoteric. Perfluoro surfactants are preferred. Particularly preferred are non-ionic perfluoro surfactants. Said surfactants can be used alone or preferably in combination.

The coverage of the coated layer ranges preferably from 0.3 to 20 g/m², more preferably from 0.5 to 5 g/m². The amount of hydrophobic thermoplastic polymer particles contained in the coated layer is preferably between 50 and 90% by weight and more preferably between 60 and 80% by weight of the total weight of said layer.

The substrate used in the present invention can be a plastic support or a ceramic but is preferably a metal such as aluminum. The substrate has a hydrophilic surface and is preferably characterized by a roughness value of at least 0.2 $\mu$m, more preferably of at least 0.3 $\mu$m, e.g. electrochemically and/or mechanically grained and anodized aluminum. The substrate can be a sheet-like material such as a plate but, alternatively, the coating solution may be applied directly to the plate cylinder of a rotary printing press, said cylinder thereby acting as the substrate. The lithographic substrate can also be a seamless sleeve printing plate, obtained by e.g. soldering a plate into a cylindrical form by means of a laser. The sleeve then can be slid around the plate cylinder instead of mounting a conventional printing plate. More details on sleeves are given in "Grafisch Nieuws", 15, 1995, page 4 to 6.

The exposure of the imaging material obtained by coating the above coating solution on the lithographic substrate can be carried out by means of direct thermal recording using e.g. a thermal head, or by irradiation with high intensity light. In the latter embodiment, the heat-sensitive material preferably comprises a compound capable of converting light into heat, preferably a compound having sufficient absorption in the wavelength range of the light source used for image-wise exposure. Particularly useful compounds are for example dyes and in particular infrared dyes as disclosed in EP-A 908 307 and pigments and in particular infrared pigments such as carbon black, metal carbides, borides, nitrides, carbonitrides, bronze-structured oxides and oxides structurally related to the bronze family but lacking the A component e.g. $WO_{2.9}$. It is also possible to use conductive polymer dispersions such as polypyrrole, polyaniline or polythiophene-based conductive polymer dispersions. The lithographic performance and in particular the print endurance obtained depends i.a. on the heat-sensitivity of the imaging material. In this respect it has been found that carbon black yields very good and favorable results.

Image-wise exposure in the method of the present invention is preferably an image-wise scanning exposure involving the use of a laser or L.E.D. Preferably used are lasers that operate in the infrared or near-infrared, i.e. wavelength range of 700–1500 nm. Most preferred are laser diodes emitting in the near infrared.

The printing method of the present invention will be further described hereinafter according to a preferred embodiment. First, a grained and anodized aluminum plate is mounted on the plate cylinder of a rotary printing press. Then, the coating solution described above is sprayed on the hydrophilic lithographic surface of the plate, so as to form a continuous imaging layer. Preferred values of the spraying parameters have been defined in EP-A no. 99203064 and EP-A no. 99203065, both filed on Sep. 15, 1999. The imaging layer is then image-wise exposed by a laser device which is integrated in the printing press e.g. as described in U.S. Pat. Nos. 5,163,368 and 5,174,205 whereby the exposed areas are converted to hydrophobic ink-accepting areas while the unexposed areas remain hydrophilic. The hydrophobic areas define the printing areas of the master. Subsequently, printing is started by applying ink and a fountain solution to the printing master. In order to dissolve and remove the non-exposed areas of the coated layer effectively, only fountain solution is preferably supplied during a few revolutions of the press (about 10), and then also ink is fed to the plate. After the press run, the lithographic substrate is recycled by treatment with a cleaning liquid as described above. Finally, the substrate can be rinsed with water or an aqueous solution and dried and then, a new printing cycle can be started by spraying the coating solution to the recycled substrate.

The cleaning step can be executed in a cleaning unit similar to the known blanket cleaning system. According to that embodiment, a cloth is preferably moistened with the cleaning liquid, contacted with the printed plate during 1 to 50, more preferably during 2 to 10 revolutions with a contacting pressure between $10^4$ and $6\times10^5$ Pa at a rotation speed in the range of 2 to 50 m/min. Afterwards the contact between the printing surface and the cleaning cloth is disrupted and the cloth is transported until a dry and clean part of the cloth is available.

The cleaner can also be applied by spraying, coating or jetting the cleaning liquid on the lithographic substrate or on the cloth. The removal of the ink-accepting areas can also be effected with another absorbing medium than a cloth. Cleaning can also be effected by combining the treatment with the cleaning liquid of the present invention with other means of mechanical cleaning such as a rotating brush or by jetting water or a volatile medium such as air, a solvent or dry ice pellets. Also vacuum extraction can be used during the cleaning treatment.

All the steps of the method of the present invention are preferably performed on-press. Alternatively, the lithographic substrate can also be mounted on a drum in a dedicated coating apparatus (off-press coating) and subsequently be mounted on a plate setter for image-wise exposure (off-press exposure). Then, the printing master thus obtained can be mounted on a press cylinder and printing is started by supplying ink and a fountain solution. After the press run, the plate can be cleaned as described above, either on-press or in a dedicated cleaning apparatus, and the recycled substrate can then be used again in a next printing cycle.

EXAMPLES

The following examples illustrate the present invention without limiting it thereto. All parts and percentages are by weight unless otherwise specified.

Example 1: Comparative Example

Preparation of the Lithographic Base

A 0.30 mm thick aluminum foil was degreased by immersing the foil in an aqueous solution containing 5 g/l of sodium hydroxide at 50° C. and rinsed with demineralized water. The foil was then electrochemically grained using an alternating current in an aqueous solution containing 4 g/l of hydrochloric acid, 4 g/l of hydroboric acid and 5 g/l of aluminum ions at a temperature of 35° C. and a current density of 1200 A/m² to form a surface topography with an average center-line roughness Ra of 0.5 μm.

After rinsing with demineralized water the aluminum foil was then etched with an aqueous solution containing 300 g/l of sulfuric acid at 60° C. for 180 seconds and rinsed with demineralized water at 25° C. for 30 seconds.

The foil was subsequently subjected to anodic oxidation in an aqueous solution containing 200 g/l of sulfuric acid at a temperature of 45° C., a voltage of about 10 V and a current density of 150 A/m² for about 300 seconds to form an anodic oxidation film of 3.00 g/m² of $Al_2O_3$ then washed with demineralized water, post-treated with a solution containing polyvinylphosphonic acid and subsequently with a solution containing aluminum trichloride, rinsed with demineralized water at 20° C. during 120 seconds and dried.

Preparation of Spray Solution

A 2.61% wt solution in water was prepared by mixing polystyrene latex, a heat absorbing compound and a hydrophilic binder. After spraying and drying, the resulting layer contained 75% W/W of the polystyrene latex, 10% of the heat absorbing compound, presented in formula (I) and 15% W/W of polyacrylic acid (sold under the trade name GLAS-COL E15 available at N.V. Allied Colloids Belgium) as hydrophilic binder.

Formula (I)

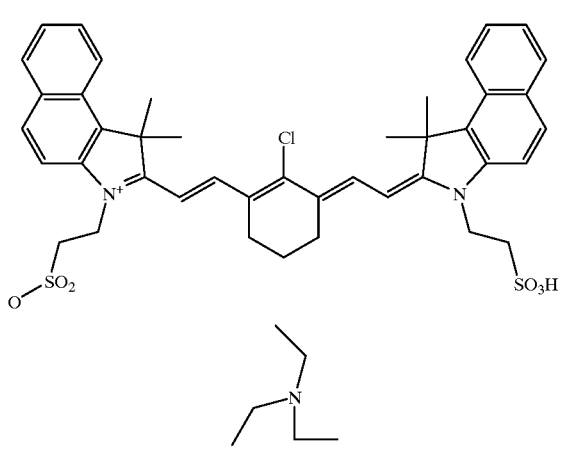

Preparation of the Heat-Mode Imaging Element

The above solution was sprayed onto the lithographic base. Therefore, the lithographic base was mounted on a drum, rotating at a line speed of 164 m/min. The imaging element was coated by a spray nozzle moving in transverse direction at a speed of 1.5 m/min. The spray nozzle was mounted on a distance of 80 mm between nozzle and receiving substrate. The flow rate of the spray solution was set to 7 ml/min. During the spray process an air pressure of 90 psi was used on the spray head. The coating was dried at an air temperature of 70° C. during the spraying process.

The spray nozzle used was of the type SUJ1, an air assisted spray nozzle, commercially available at Spraying Systems Belgium, Brussels.

Printing Step

The above mentioned heat mode imaging element was exposed in a Creo 3244™ external drum platesetter at 2400 dpi at 150 rpm with a power setting of 15.5 Watt. The imaged plates were printed on a GTO46 printing press with K+E 800 Skinnex ink, fountain (Combifix XL (4%) from Hostman-Steinberg and isopropylalcohol (10%) in water) to a run length of 5000. The print quality was evaluated.

Cleaning Step

After printing, the plate that still contained the adhered ink was cleaned by use of a cleaner composition and a high pressure washer. In this process, the following procedure was used:

10 ml/m² of a mixture of 50% W/W dipentene (commercially available from Sigma-Aldrich) and 50% W/W of butoxyethanol was sprayed, using a manual pressure sprayer commercially available from Premal Sprayer Division of Precision Valve Corporation, New York.

After a time lapse of 30 s during which the cleaning liquid was allowed to interact with the coating, the plate was cleaned with a conventional high pressure washer, using a volume of water of 10 liter/m².

Finally, the plate was dried with pressurized air at room temperature until the plate surface seems visually dry.

Next Cycle

The procedure of spraying, imaging, printing and cleaning was repeated. In the second cycle, the plate was imaged with a full plane of a 50% screen. Afterwards, the plate cleanliness and print characteristics were evaluated.

Example 2 : Comparative Example

The same procedure as mentioned in example was repeated however as the cleaner composition an emulsion of 10% W/W of dipentene, 14% of butoxyethanol and 10% W/W of polyalkylene oxide (emulsifying agent, available under the trade name AKYPO® OP80 from Chem-Y) in water was used.

Example 3

The same procedure as mentioned in example 1 was repeated however as the cleaner composition an emulsion of 10% W/W of dipentene, 14% of butoxyethanol, 4% of phosphoric acid and 10% W/W of polyalkylene oxide (emulsifying agent, available under the trade name AKYPO® OP80 from Chem-Y) in water was used.

Example 4 same procedure as mentioned in example 1 was repeated however as the cleaner composition an emulsion of 5% W/W of dipentene, 7% of butoxyethanol, 4% of phosphoric acid and 10% W/W of polyalkylene oxide (emulsifying agent, available under the trade name AKYPO® OP80 from Chem-Y) in water was used.

Example 5

The same procedure as mentioned in example 1 was repeated however as the cleaner composition an emulsion of 10% W/W of dipentene, 14% of butoxyethanol, 1.5% of phosphoric acid and 10% W/W of polyalkylene oxide (emulsifying agent, available under the trade name AKYPO® OP80 from Chem-Y) in water was used.

Results of Recoat and Lithographic Quality

After the first cleaning step mentioned above, the quality of the cleaned plate was observed. For examples 3 to 5, visually perfectly cleaned materials were obtained and a very good print quality, more specifically in respect to staining behavior and ghost images, was observed (see table 1). Also after multiple cycles using the same substrate (up to 20) a good lithographic quality was maintained.

TABLE 1

| Example | Cleaning quality | Presence of ghost images | Content of organic solvent in the cleaning liquid |
|---|---|---|---|
| 1(*) | 1 | 1 | High |
| 2(*) | 2 | 3 | Low |
| 3 | 1 | 0 | Low |
| 4 | 3 | 1 | Low |
| 5 | 1 | 0 | Low |

(*) comparative example
0 very good
1 good
2 acceptable
3 poor

We claim:

1. Method for removing ink-accepting areas of a lithographic printing master comprising a cleaning step wherein a cleaning liquid is applied to the printing master, the cleaning liquid being an emulsion of an organic compound in water, further comprising a compound according to formula (I):

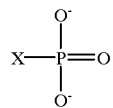
(I)

wherein X is OH, O⁻ or a polymer backbone, and wherein the organic compound is a mixture of an alcohol and a cyclic compound having at least one double bond.

2. Method according to claim 1 wherein the compound according to formula (I) is phosphoric acid or a phosphate salt.

3. Method according to claim 1 wherein the cyclic compound is dipentene.

4. Method according to claim 3 wherein the alcohol is an aliphatic alcoholether.

5. Method according to claim 4, wherein the aliphatic alcoholether is butoxyethanol.

6. Method according to claim 1 wherein the alcohol is an aliphatic alcoholether.

7. Method according to claim 6 wherein the alcohol is butoxyethanol.

8. Method according to claim 1 wherein the cleaning liquid is an aqueous emulsion further comprising an emulsifying agent.

9. Method according to claim 8 wherein the emulsifying agent is a compound containing polyalkylene oxide.

10. Method according to claim 1 wherein during the cleaning step the printing master is treated by a cloth, a rotating brush, by jetting water or by jetting a volatile medium.

11. Direct-to-plate method of lithographic printing with a reusable substrate having a hydrophilic surface comprising the steps of:

(a) making a negative-working imaging material by applying on the hydrophilic surface a coating solution comprising hydrophobic thermoplastic particles and a hydrophilic binder;

(b) making a printing master having ink-accepting areas by image-wise exposing the imaging material;

(c) applying ink and fountain solution to the printing master;

(d) removing the ink-accepting areas from the printing master by a method comprising a cleaning step wherein a cleaning liquid is applied to the printing master, the cleaning liquid being an emulsion of an organic compound in water, further comprising a compound according to formula (I):

(I)

wherein X is OH, O⁻ or a polymer backbone, and wherein the organic compound is a mixture of an alcohol and a cyclic compound having at least one double bond.

12. Method according to claim 11 wherein the reusable substrate is a plate cylinder of a rotary press or a plate or sleeve mounted on a plate cylinder of a rotary press.

13. Method according to claim 11 wherein the coating solution is sprayed or jetted onto the substrate.

14. Method according to claim 11 wherein the cleaning liquid is sprayed or jetted onto the substrate.

15. Method of claim 11 wherein the cyclic compound is dipentene.

16. Method according to claim 15, wherein the alcohol is an aliphatic alcoholether.

17. Method according to claim 16 wherein the aliphatic alcoholether is butoxyethanol.

18. Method of claim 11 wherein the alcohol is an aliphatic alcoholether.

19. Method of claim 18 wherein the alcohol is butoxyethanol.

20. Method according to claim 11 wherein the cleaning liquid is an aqueous emulsion further comprising an emulsifying agent.

21. Method of claim 20 wherein the emulsifying agent is a compound containing polyalkylene oxide.

* * * * *